United States Patent
Jiehuang (10) Patent No.: US 10,516,003 B2
(45) Date of Patent: Dec. 24, 2019

(54) PIXEL ARRANGEMENT STRUCTURE OF ORGANIC LIGHT-EMITTING DIODE DISPLAY PANEL AND MASK

(71) Applicant: EverDisplay Optronics (Shanghai) Limited, Shanghai (CN)

(72) Inventor: Wu Jiehuang, Shanghai (CN)

(73) Assignee: EVERDISPLAY OPTRONICS (SHANGHAI) LIMITED, Shanghai (CN)

( * ) Notice: Subject to any disclaimer, the term of this patent is extended or adjusted under 35 U.S.C. 154(b) by 16 days.

(21) Appl. No.: 15/275,761

(22) Filed: Sep. 26, 2016

(65) Prior Publication Data
US 2017/0092700 A1 Mar. 30, 2017

(30) Foreign Application Priority Data

Sep. 25, 2015 (CN) .......................... 2015 1 0623060

(51) Int. Cl.
| | |
|---|---|
| *H01L 27/32* | (2006.01) |
| *H01L 51/56* | (2006.01) |
| *H01L 51/00* | (2006.01) |

(52) U.S. Cl.
CPC .......... *H01L 27/3218* (2013.01); *H01L 51/56* (2013.01); *H01L 27/3211* (2013.01); *H01L 51/0008* (2013.01)

(58) Field of Classification Search
USPC .......................................................... 257/40
See application file for complete search history.

(56) References Cited

U.S. PATENT DOCUMENTS

| | | | |
|---|---|---|---|
| 2010/0039698 A1* | 2/2010 | Robinson | H04N 13/0404 359/316 |
| 2011/0019041 A1* | 1/2011 | Ishiwata | H01L 27/14621 348/280 |
| 2011/0279705 A1* | 11/2011 | Kuang | H04N 5/343 348/229.1 |
| 2013/0021328 A1* | 1/2013 | Yang | G09G 3/3208 345/419 |
| 2014/0210028 A1 | 7/2014 | Chen et al. | |
| 2014/0284570 A1* | 9/2014 | Jinta | H01L 27/3218 257/40 |

(Continued)

FOREIGN PATENT DOCUMENTS

| | | |
|---|---|---|
| CN | 1542529 | 11/2004 |
| CN | 101576661 | 11/2009 |

*Primary Examiner* — Nilufa Rahim
(74) *Attorney, Agent, or Firm* — Terry M. Sanks, Esq.; Beusse Wolter Sanks & Maire, PLLC (57) ABSTRACT

The disclosure relates to a pixel arrangement structure of an organic light-emitting diode display panel, comprises a plurality of pixel groups, each of the pixel groups comprises a plurality of pixel areas, each of the pixel areas comprises any two or three kinds of pixels of first pixels, second pixels and third pixels, wherein the first pixels, the second pixels and the third pixels of each of the pixel groups are configured in an amount ratio of 1:2:1. Each pixel area comprises two kinds of pixels cooperatively used with the adjacent third pixels under the condition of forming different colors, to improve pixel utilization. In order to obtain at least two kinds of pixels in each pixel area, it is to increase area of the aperture during manufacturing the fine metal mask so as to improve aperture ratio of the pixel.

8 Claims, 6 Drawing Sheets

(56) References Cited

U.S. PATENT DOCUMENTS

2015/0021637 A1* 1/2015 Ahn .................... H01L 27/3218
    257/89
2016/0357076 A1* 12/2016 Huangfu ........... G02F 1/134336

* cited by examiner

PIXEL ARRANGEMENT STRUCTURE OF ORGANIC LIGHT-EMITTING DIODE DISPLAY PANEL AND MASK

CROSS-REFERENCE TO RELATED APPLICATIONS

The present application claims priority to and the benefit of Chinese Patent Application No. CN 201510623060.3, filed on Sep. 25, 2015, the entire content of which is incorporated herein by reference.

BACKGROUND OF THE DISCLOSURE

1. Field of the Disclosure

The disclosure relates to the field of semiconductor display device technology, more specifically, to a pixel arrangement structure of an organic light-emitting diode display panel and a mask.

2. Description of the Related Art

OLED (organic light-emitting diode) has become the third generation of display technology after LCD due to the unique display characteristics of emitting light, large angle of visibility, wide color gamut, short reaction time and high contrast, and the advantages of lightweight, flexibility and so on.

In the traditional technology, the traditional pixel area is composed by R, G, and B three kinds of pixels, and a single pixel under the Pentile arrangement is different; each pixel only consists of sub-pixels with two kinds of the colors; usually the Pentile arrangement only consists of RG and BG pixels. However only red, green, and blue the three primary colors can make up all colors, and two kinds of the colors cannot make up all colors, therefore when display images, a pixel with the Pentile arrangement will borrow another color of the pixel adjacent to constitute the three primary colors. In a horizontal or a vertical direction, each pixel shares the sub-pixels of the colors, which the pixel does not have, with adjacent pixels, so as to achieve white display together.

Each aperture in a mask corresponds to the aperture of a pixel. During vapor deposition, the linear evaporation source is arranged in a horizontal line, and the scanning direction is vertical to the horizontal line, due to existence of the angle of evaporation of the evaporation source and a certain gap between the mask and the glass substrate, and dotted line is the size of the generated shadow, and apertures of pixels are spaced tightly, and space between the apertures is small, therefore it causes the space between the apertures of the mask small; during the vapor deposition process, split evaporation will easily occur, which reduces the aperture ratio (the ratio of light-emitting area to total area of the pixel) and pixels per inch (PPI).

SUMMARY OF THE DISCLOSURE

In view of the shortcomings of the prior art, the present disclosure aims at improving PPI of organic light-emitting diode display panel, and provides a pixel arrangement structure of an organic light-emitting diode display panel and a mask.

Technical solutions of the present disclosure are:

A pixel arrangement structure of an organic light-emitting diode display panel, comprising:

a plurality of pixel groups, each of the pixel groups comprising a plurality of pixel areas, each of the pixel areas comprising any two or three kinds of pixels of first pixels, second pixels and third pixels, the first pixels, the second pixels and the third pixels being different colors, wherein the first pixels, the second pixels and the third pixels of each of the pixel groups are configured in an amount ratio of 1:2:1.

Preferably, in the above-mentioned pixel arrangement structure of the organic light-emitting diode display panel, the pixel groups comprise first pixel areas and second pixel areas; the first pixel areas and the second pixel areas are matrix-arranged and have same areas;

the first pixel areas comprise the first pixels and the second pixels arranged circularly adjacently in order in a vertical direction;

the second pixel areas comprise the third pixels and the second pixels arranged circularly adjacently in order in a vertical direction; wherein the third pixels are adjacent to the second pixels in the first pixel areas;

the pixel groups are made of the first pixel areas and the second pixel areas are spaced alternately in a horizontal direction.

Preferably, in the above-mentioned pixel arrangement structure of the organic light-emitting diode display panel, the pixel groups comprise third pixel areas and fourth pixel areas; the third pixel areas and the fourth pixel areas are matrix-arranged and have same areas;

the third pixel areas comprise the first pixels and the second pixels arranged adjacently in order, and circulated to form a row in a horizontal direction;

the fourth pixel areas comprise the third pixels and the second pixels arranged adjacently in order, and circulated to form a row in a horizontal direction; wherein the second pixels in the fourth pixel areas and the second pixels in the first pixel areas are in a same column;

the pixel groups are made of the third pixel areas and the fourth pixel areas spaced alternately in a vertical direction.

Preferably, in the above-mentioned pixel arrangement structure of the organic light-emitting diode display panel, the pixel groups comprise fifth pixel areas, sixth pixel areas, seventh pixel areas and eighth pixel areas; the fifth pixel areas, the sixth pixel areas, the seventh pixel areas and the eighth pixel areas are matrix-arranged and have same areas;

the fifth pixel areas comprise the first pixels and the second pixels arranged adjacently in order, and circulated to form a row in a horizontal direction;

the sixth pixel areas comprise the third pixels and the second pixels arranged adjacently in order, and circulated to form a row in a horizontal direction; wherein the second pixels in the sixth pixel areas and the second pixels in the fifth pixel areas are in a same column;

the seventh pixel areas comprise the second pixels and the first pixels arranged adjacently in order, and circulated to form a row in a horizontal direction; wherein the second pixels in the seventh pixel areas and the third pixels in the sixth pixel areas are in a same column;

the eighth pixel areas comprise the second pixels and the third pixels arranged adjacently in order, and circulated to form a row in a horizontal direction; wherein the second pixels in the eighth pixel areas and the second pixels in the seventh pixel areas are in a same column;

the pixel groups are made of the fifth pixel areas, the sixth pixel areas, the seventh pixel areas and the eighth pixel areas spaced alternately in a vertical direction.

Preferably, in the above-mentioned pixel arrangement structure of the organic light-emitting diode display panel, the pixel groups comprise a pair of ninth pixel areas and a pair of tenth pixel areas;

the ninth pixel areas comprise the first pixels and the second pixels arranged adjacently in order; the pair of ninth pixel areas is arranged in a vertical direction;

the tenth pixel areas comprise the third pixels and the second pixels arranged adjacently in order; the pair of tenth pixel areas is arranged in a vertical direction;

the pair of ninth pixel areas and the pair of tenth pixel areas are spaced alternately in a horizontal direction and a vertical direction respectively, to make the second pixels in the ninth pixel areas and the second pixels in the tenth pixel areas in a same column.

Preferably, in the above-mentioned pixel arrangement structure of the organic light-emitting diode display panel, areas of the first pixels, the second pixels and the third pixels are same.

Preferably, in the above-mentioned pixel arrangement structure of the organic light-emitting diode display panel, the first pixels, the second pixels and the third pixels are configured to emit light with different colors.

Preferably, in the above-mentioned pixel arrangement structure of the organic light-emitting diode display panel, the first pixels emit red light, the second pixels emit green light, and the third pixels emit blue light.

A mask, used in vapor deposition process of the above-mentioned pixel arrangement structure of the organic light-emitting diode display panel, wherein apertures of different pixels in each of the pixel areas are arranged in a diagonal form, and the aperture of the first pixel in a first pixel row is adjacent to the aperture of the first pixel in a second pixel row.

Preferably, in the above-mentioned mask, the aperture is rectangular, and horizontally configured on the display panel.

A mask, used in vapor deposition process of the above-mentioned pixel arrangement structure of the organic light-emitting diode display panel, wherein a first kind of apertures corresponding to pixels in a column with same color of the pixel groups are configured adjacently, and in the pixel groups, a second kind of apertures corresponding to pixels in a column with different colors are mutually evenly spaced.

Preferably, in the above-mentioned mask, the area of the first kind of apertures is smaller than the area of the second kind of apertures, and the first kind of apertures and the second kind of apertures are all vertically configured on the display panel.

Compared with the prior art, advantages of the disclosure are:

The pixel arrangement structure of the organic light-emitting diode display panel comprises a plurality of pixel groups arranged repeatedly circularly, and each of the pixel groups comprises a plurality of pixel areas, each of the pixel areas comprises any two or three kinds of pixels of first pixels, second pixels and third pixels, and colors and order of the pixels contained in different pixel areas are not identical. Each pixel area comprises two kinds of pixels cooperatively used with the adjacent third pixels under the condition of forming different colors, to improve pixel utilization. In order to obtain at least two kinds of pixels in each pixel area, during manufacturing the fine metal mask, increase area of the aperture, improve aperture ratio of the pixel and reduce the requirement of manufacturing precision of the fine metal mask, to reduce the difficulty of manufacturing pixels.

BRIEF DESCRIPTIONS OF THE DRAWINGS

The accompanying drawings, together with the specification, illustrate exemplary embodiments of the present disclosure, and, together with the description, serve to explain the principles of the present disclosure.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. Like reference numerals refer to like elements throughout.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

A pixel arrangement structure of an organic light-emitting diode display panel, comprises a plurality of pixel groups, first pixels, second pixels and third pixels;

wherein, each of the pixel groups are made of at least one pixel area, and each of the pixel areas comprises a plurality of pixels; and the first pixels, the second pixels and the third pixels are spaced in the pixel area, and configured in an amount ratio of 1:2:1.

In the disclosure, the pixel arrangement structure of the organic light-emitting diode display panel comprises a plurality of pixel groups arranged repeatedly circularly, and each of the pixel groups comprises a plurality of pixel areas, each of the pixel areas comprises any two or three kinds of pixels of first pixels, second pixels and third pixels having different colors; and the colors and order of the pixels contained in different pixel areas are not identical. Each pixel area comprises two kinds of pixels cooperatively used with the adjacent third pixels under the condition of forming different colors, to improve pixel utilization. In order to obtain at least two kinds of pixels in each pixel area, during manufacturing the fine metal mask (FMM), increasing the area of the aperture 104, improving aperture 104 ratio of the pixel, and reduce the requirement of manufacturing precision of the fine metal mask, to reduce the difficulty of manufacturing pixels.

Figure 1:
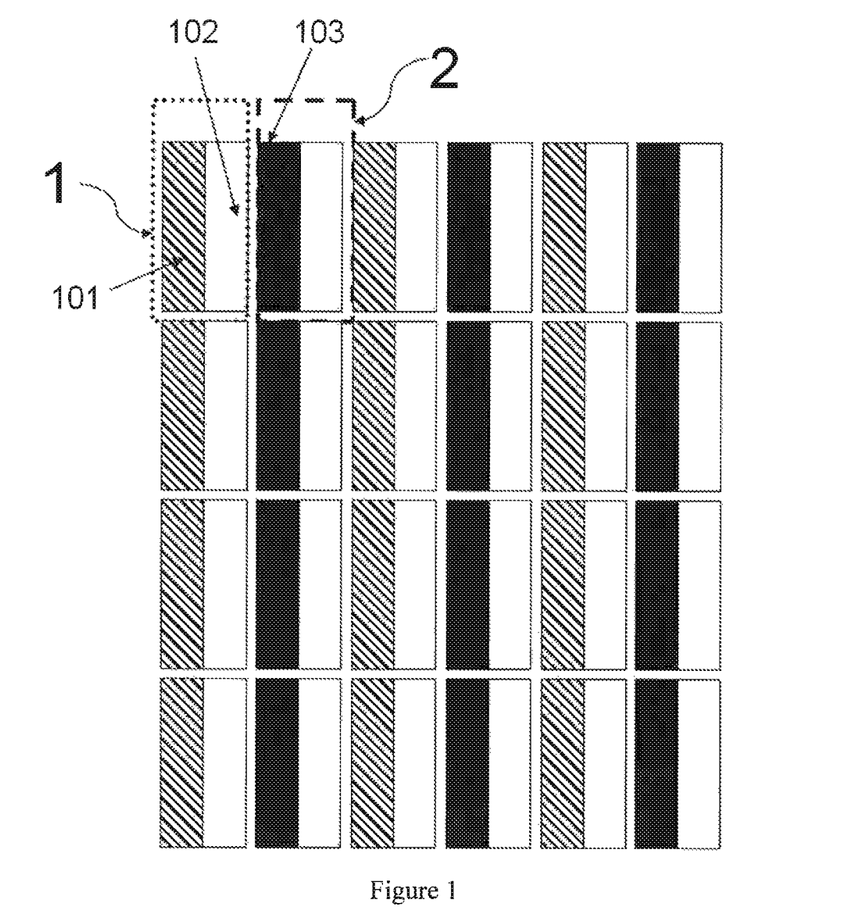
FIG. 1 is a diagram of an embodiment of the pixel arrangement structure of the organic light-emitting diode display panel of the disclosure.

As shown in the FIG. 1, as a further preferred embodiment, in the above-mentioned pixel arrangement structure of an organic light-emitting diode display panel, the pixel groups comprise first pixel areas 1 and second pixel areas 2; the first pixel areas 1 and the second pixel areas 2 are matrix-arranged and have same areas;

the first pixel areas 1 comprise the first pixels 101 and the second pixels 102 arranged circularly adjacently in order in a vertical direction;

the second pixel areas 2 comprise the third pixels 103 and the second pixels 102 arranged circularly adjacently in order in a vertical direction; wherein the third pixels 103 are adjacent to the second pixels 102 of the first pixel areas;

the pixel groups are made of the first pixel areas 1 and the second pixel areas 2 spaced alternately in a horizontal direction.

Figures 5, 6:
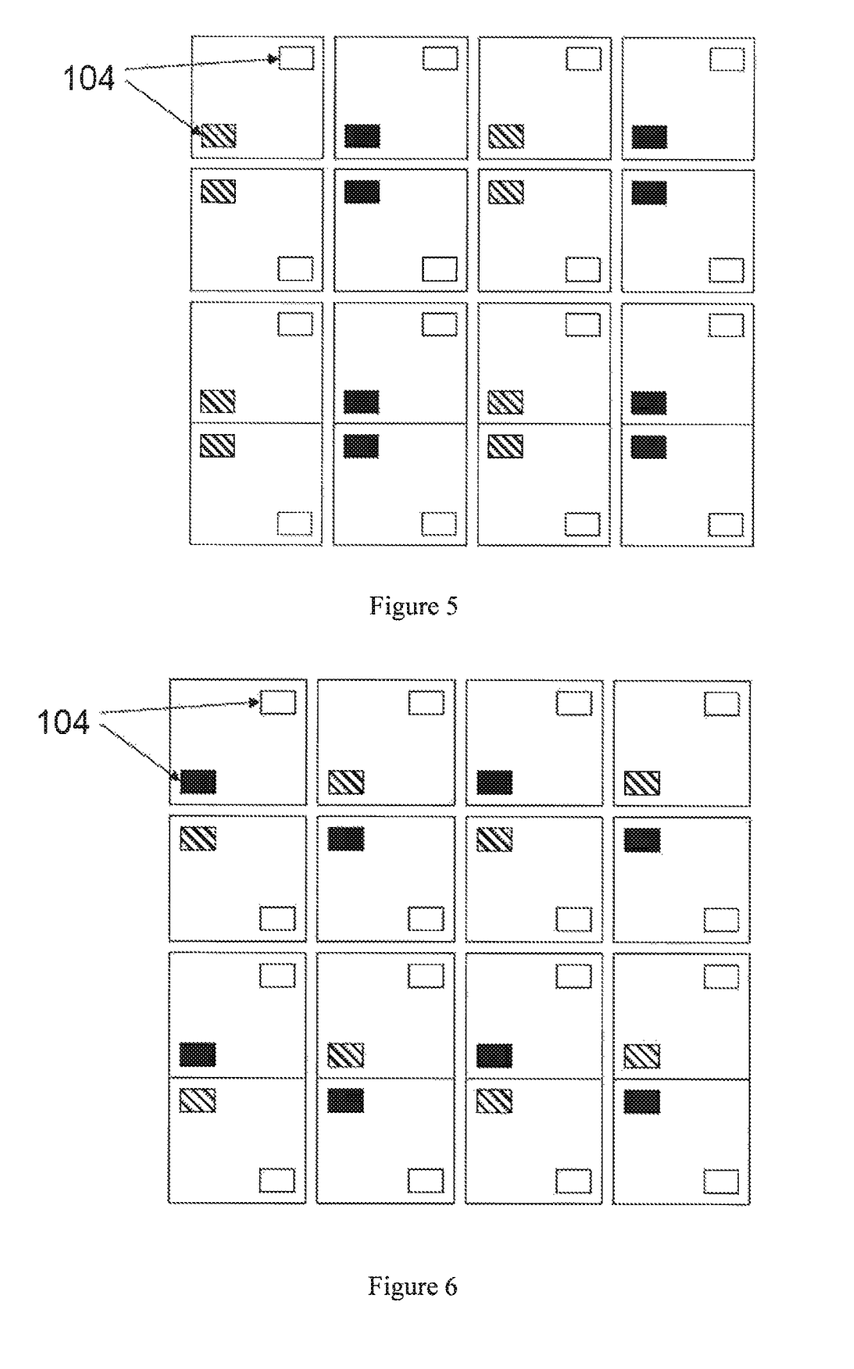
FIG. 5 is a structure diagram of an embodiment of the mask of the disclosure.
FIG. 6 is a structure diagram of an embodiment of the mask of the disclosure.

In order to make the above-mentioned pixel arrangement structure of the organic light-emitting diode display panel obtain better PPI, as shown in the FIG. 5, the present disclosure also provides a mask used in vapor deposition process of the above-mentioned pixel arrangement structure of the organic light-emitting diode display panel, wherein apertures 104 of different pixels in each pixel area are arranged in a diagonal form, and the pixel aperture 104 of the first pixel 101 in the first pixel row is adjacent to the pixel aperture 104 of the first pixel 101 in the second pixel row. The pixel aperture 104 is rectangular, and horizontally configured on the display panel. Using the form of a diagonal makes the interval between pixel apertures 104 in the same pixel area maximized, thus makes the pixel apertures 104 in the same pixel area minimized, therefore benefit to reduce manufacturing difficulty of the mask without reducing PPI.

Figure 2:
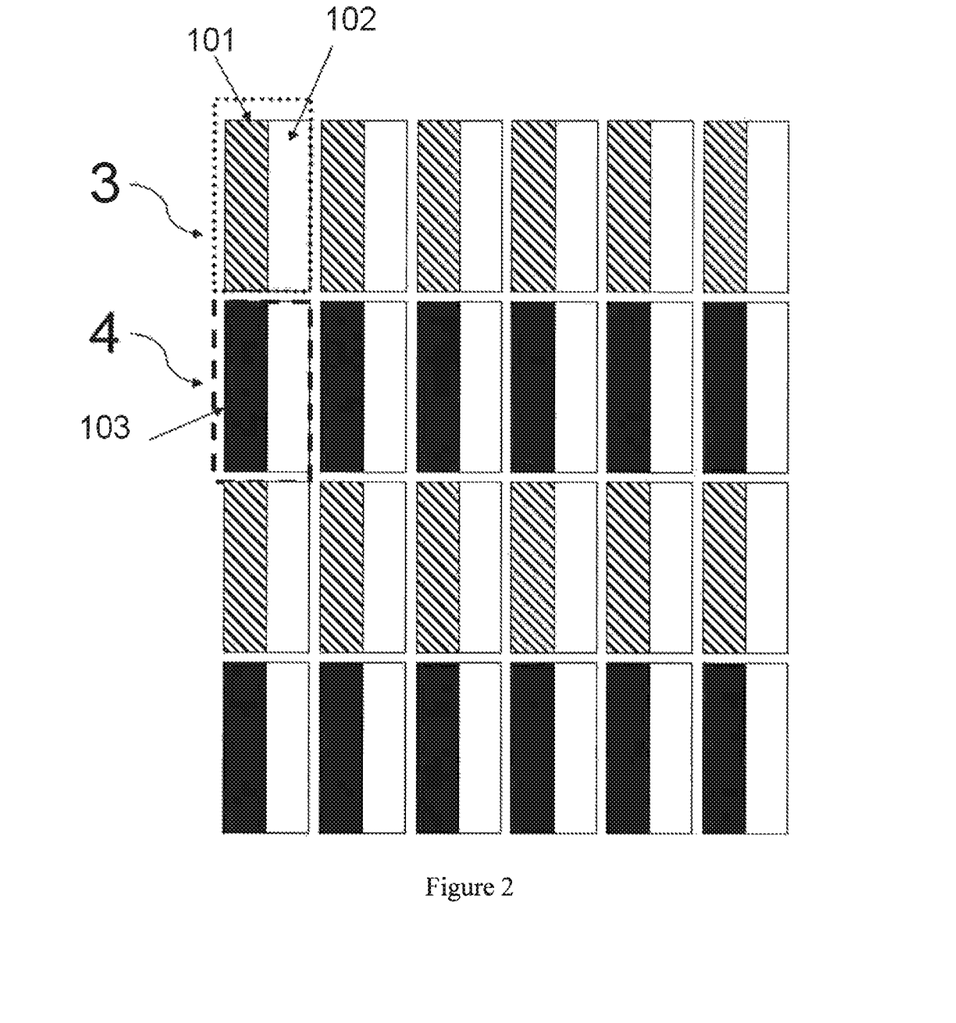
FIG. 2 is a diagram of an embodiment of the pixel arrangement structure of the organic light-emitting diode display panel of the disclosure.

As shown in the FIG. 2, as a further preferred embodiment, in the above-mentioned pixel arrangement structure of the organic light-emitting diode display panel, the pixel groups comprise third pixel areas 3 and fourth pixel areas 4; the third pixel areas 3 and fourth pixel areas 4 are matrix-arranged and have same areas;

the third pixel areas 3 comprise the first pixels 101 and the second pixels 102 arranged adjacently in order, and circulated to form a row in a horizontal direction;

the fourth pixel areas 4 comprise the third pixels 103 and the second pixels 102 arranged adjacently in order, and circulated to form a row in a horizontal direction; wherein the second pixels 102 and the second pixels 102 in the first pixel areas are in a same column;

the pixel groups are made of the third pixel areas 3 and the fourth pixel areas 4 spaced alternately in a vertical direction.

Figure 7:
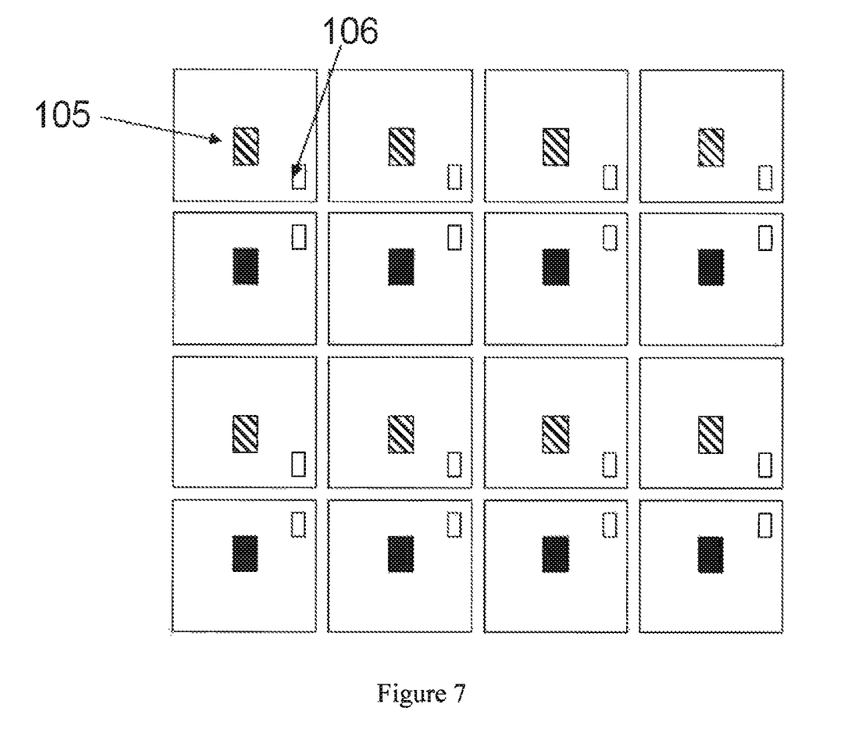
FIG. 7 is a structure diagram of an embodiment of the mask of the disclosure.

In order to make the above-mentioned pixel arrangement structure of the organic light-emitting diode display panel obtain better PPI, as shown in the FIG. 7, the disclosure also provides a mask used in vapor deposition process of the above-mentioned pixel arrangement structure of an organic light-emitting diode display panel, wherein the first kind of apertures 106 corresponding to pixels in a column with same color of the pixel groups are configured adjacently; and in the pixel groups, the second kind of apertures 105 corresponding to pixels in a column with different colors are evenly spaced. The area of the first kind of apertures 106 is smaller than area of the second kind of apertures 105, and the first kind of apertures 106 and the second kind of apertures 105 are vertically configured on the display panel. Pixels with same color are adjacently configured, since separately configuring pixels with same color is easy to cause perforations during the manufacturing process of the mask.

Figure 3:
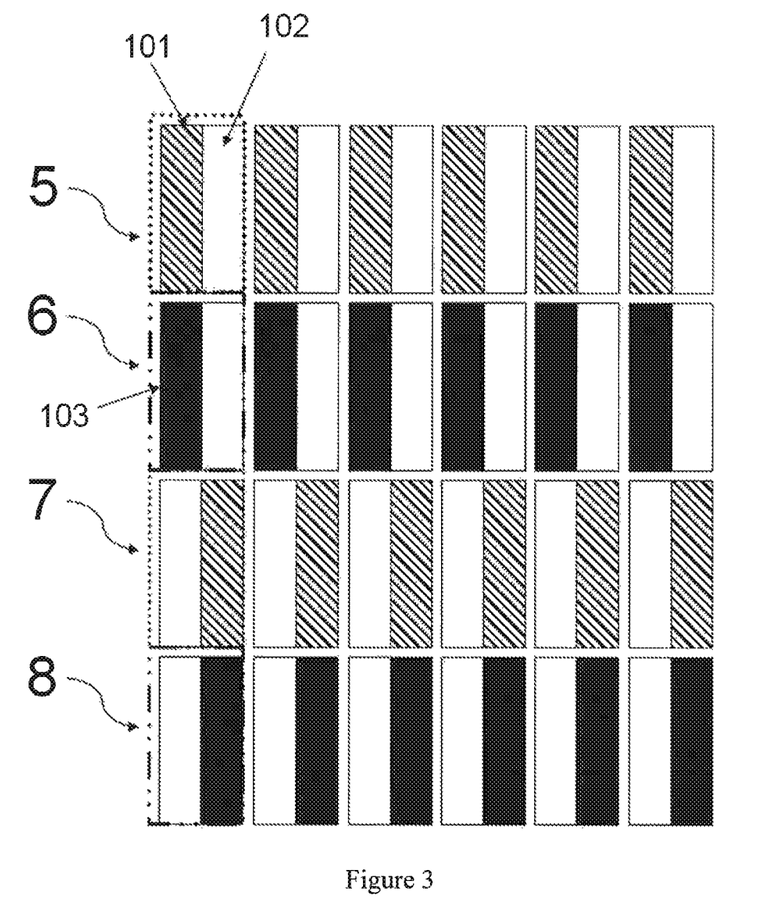
FIG. 3 is a diagram of an embodiment of the pixel arrangement structure of the organic light-emitting diode display panel of the disclosure.

As shown in the FIG. 3, as a further preferred embodiment, in the above-mentioned pixel arrangement structure of the organic light-emitting diode display panel, the pixel groups comprise fifth pixel areas 5, sixth pixel areas 6, seventh pixel areas 7 and eighth pixel areas 8; the fifth pixel areas 5, the sixth pixel areas 6, the seventh pixel areas 7 and the eighth pixel areas 8 are matrix-arranged and have same areas;

the fifth pixel areas 5 comprise the first pixels 101 and the second pixels 102 arranged adjacently in order, and circulated to form a row in a horizontal direction;

the sixth pixel areas 6 comprise the third pixels 103 and the second pixels 102 arranged adjacently in turn, and circulated to form a row in a horizontal direction; wherein the second pixels 102 in the sixth pixel areas 6 and the second pixels 102 in the fifth pixel areas 5 are in a same column;

the seventh pixel areas 7 comprise the second pixels 102 and the first pixels 101 arranged adjacently in order, and circulated to form a row in a horizontal direction; wherein the second pixels 102 in the seventh pixel areas 7 and the third pixels 103 in the sixth pixel areas 6 are in a same column;

the eighth pixel areas 8 comprise the second pixels 102 and the third pixels 103 arranged adjacently in turn, and circulated to form a row in a horizontal direction; wherein the second pixels 102 of the eighth pixel areas 8 and the second pixels 102 in the seventh pixel areas 7 are in a same column;

the pixel groups are made of the fifth pixel areas 5, the sixth pixel areas 6, the seventh pixel areas 7 and the eighth pixel areas 8 arranged in order in a vertical direction.

In order to make the above-mentioned pixel arrangement structure of the organic light-emitting diode display panel obtain better PPI, as shown in the FIG. 7, the disclosure also provides a mask used in vapor deposition process of the above-mentioned pixel arrangement structure of the organic light-emitting diode display panel, wherein the first kind of apertures 106 of pixels in a column with same color of the pixel groups are configured adjacently, and in the pixel groups, the second kind of apertures 105 corresponding to pixels in a column with different colors are evenly spaced. The area of the first kind of apertures 106 is smaller than area of the second kind of apertures 105, and the first kind of apertures 106 and the second kind of apertures 105 are vertically configured on the display panel, pixels with same color are adjacently configured, since separately configuring pixels with same color is easy to cause perforations during the manufacturing process of the mask.

Figure 4:
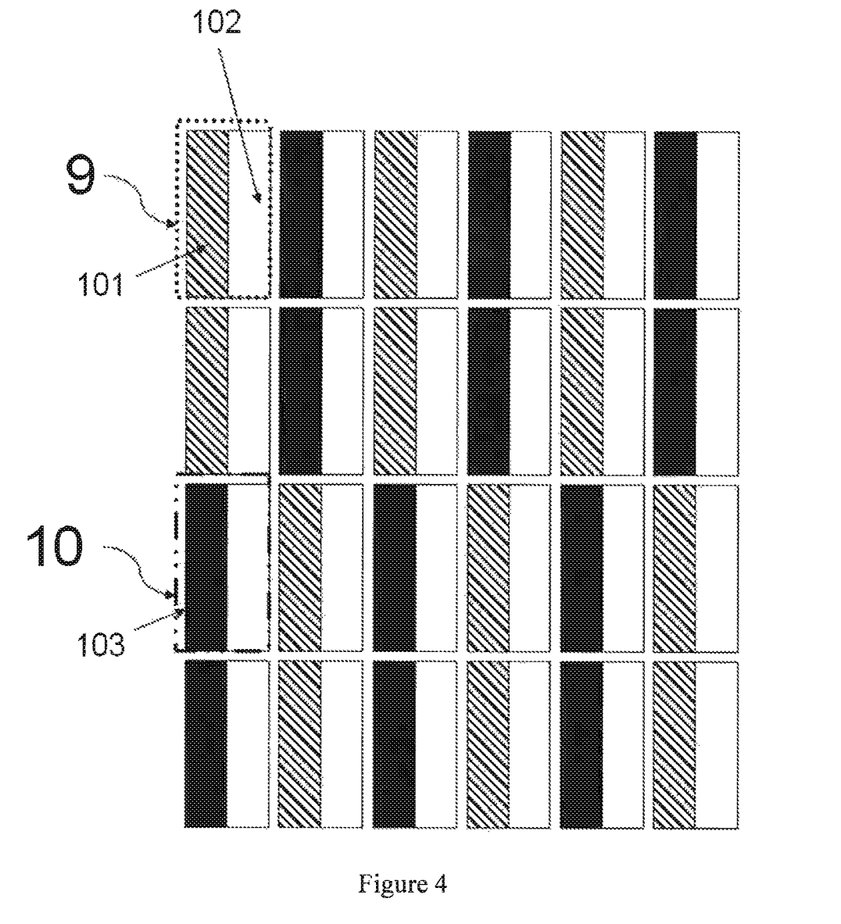
FIG. 4 is a diagram of an embodiment of the pixel arrangement structure of the organic light-emitting diode display panel of the disclosure.

As shown in the FIG. 4, as a further preferred embodiment, in the above-mentioned pixel arrangement structure of the organic light-emitting diode display panel, the pixel groups comprise a pair of ninth pixel areas 9 and a pair of tenth pixel areas 10;

the ninth pixel areas 9 comprise the first pixels 101 and the second pixels 102 arranged adjacently in order; the pair of ninth pixel areas 9 is arranged in a vertical direction;

the tenth pixel areas 10 comprise the third pixels 103 and the second pixels 102 arranged adjacently in order; the pair of tenth pixel areas 10 is arranged in a vertical direction;

the pair of ninth pixel areas 9 and the pair of tenth pixel areas 10 are spaced alternately respectively in a horizontal direction and a vertical direction, to make the second pixels 102 in the ninth pixel areas 9 and the second pixels 102 in the tenth pixel areas 10 in a same column.

In order to make the above-mentioned pixel arrangement structure of an organic light-emitting diode display panel obtain better PPI, the application also provides a mask used in vapor deposition process of the above-mentioned pixel arrangement structure of the organic light-emitting diode display panel, specifically lists two embodiments; for the first embodiment as shown in the FIG. 5, apertures 104 of different pixels in each pixel area are arranged in a diagonal form, and the pixel aperture 104 of the first pixel 101 in a first pixel row is adjacent to the pixel aperture 104 of the first pixel 101 in a second pixel row. For the second embodiment as shown in the FIG. 6, apertures 104 of different pixels in each pixel area are arranged in a diagonal form, and the pixel aperture 104 of the third pixel 103 in the first pixel row is adjacent to the pixel aperture 104 of the first pixel 101 in the second pixel row. The pixel aperture 104 is rectangular, and horizontally configured on the display panel. Using the form of diagonal makes the interval between pixel apertures 104 in the same pixel area maximized, thus makes the pixel apertures 104 in the same pixel area minimized, therefore benefit to reduce manufacturing the difficulty of the mask without reducing PPI.

As a further preferred embodiment, in the above-mentioned pixel arrangement structure of the organic light-emitting diode display panel, areas of the first pixels 101, the second pixels 102 and the third pixels 103 are same.

As a further preferred embodiment, in the above-mentioned pixel arrangement structure of the organic light-emitting diode display panel, the first pixels 101, the second pixels 102 and the third pixels 103 are configured to emit light with different colors.

As a further preferred embodiment, in the above-mentioned pixel arrangement structure of the organic light-emitting diode display panel, the first pixels 101 emit red light, the second pixels 102 emit green light, and the third pixels 103 emit blue light.

The foregoing is only the preferred embodiments of the disclosure, not thus limiting embodiments and scope of the disclosure, those skilled in the art should be able to realize that the schemes obtained from the content of specification and figures of the disclosure are within the scope of the disclosure.

What is claimed is:

1. A pixel arrangement structure of an organic light-emitting diode display panel, comprising:
   a plurality of pixel groups, each of the pixel groups comprising a plurality of pixel areas,
   each of the pixel areas comprising any two or three kinds of pixels of first pixels, second pixels and third pixels, the first pixels, the second pixels and the third pixels being different colors,
   wherein, the first pixels, the second pixels and the third pixels of each of the pixel groups are configured in an amount ratio of 1:2:1;
   wherein the pixel groups comprise third pixel areas and fourth pixel areas; the third pixel areas and the fourth pixel areas are matrix-arranged and have same areas;
   the third pixel areas consist of the first pixels and the second pixels arranged adjacently in order, and the third pixel areas are continuously circulated to form a row in a horizontal direction;
   the fourth pixel areas consist of the third pixels and the second pixels arranged adjacently in order, and the fourth pixel areas are continuously circulated to form a row in a horizontal direction; wherein the second pixels in the fourth pixel areas and the second pixels in the third pixel areas are in a same column;
   the pixel groups are made of the third pixel areas and the fourth pixel areas spaced alternately in a vertical direction;
   the organic light-emitting diode display panel further comprises a plurality of first kind of apertures and a plurality of second kind of apertures;
   wherein, an area of the plurality of the first kind of apertures is smaller than an area of the plurality of the second kind of apertures, and at least a segment of the plurality of the first kind of apertures and at least a segment of the plurality of the second kind of apertures are vertically configured on the organic light-emitting diode display panel;
   wherein the at least a segment of the plurality of the first kind of apertures corresponds to a column of pixels with a same color of a pixel group of the plurality of pixel groups arranged adjacent to the at least a segment of the plurality of the first kind of apertures,
   wherein two adjacently configured first kind of apertures of the plurality of the first kind of apertures are closure than two evenly spaced second kind of apertures of the plurality of the second kind of apertures.

2. The pixel arrangement structure of the organic light-emitting diode display panel according to claim 1, wherein areas of the first pixels, the second pixels and the third pixels are same.

3. The pixel arrangement structure of the organic light-emitting diode display panel according to claim 1, wherein the first pixels, the second pixels and the third pixels are configured to emit light with different colors.

4. The pixel arrangement structure of the organic light-emitting diode display panel according to claim 1, wherein the first pixels emit red light, the second pixels emit green light, and the third pixels emit blue light.

5. A pixel arrangement structure of an organic light-emitting diode display panel, comprising:
- a plurality of pixel groups, each of the pixel groups comprising a plurality of pixel areas, each of the pixel areas comprising any two or three kinds of pixels of first pixels, second pixels and third pixels, the first pixels, the second pixels and the third pixels being different colors,
- wherein, the first pixels, the second pixels and the third pixels of each of the pixel groups are configured in an amount ratio of 1:2:1;
- wherein the pixel groups comprise fifth pixel areas, sixth pixel areas, seventh pixel areas and eighth pixel areas; the fifth pixel areas, the sixth pixel areas, the seventh pixel areas and the eighth pixel areas are matrix-arranged and have same areas;
- the fifth pixel areas consist of the first pixels and the second pixels arranged adjacently in order, and circulated to form a row in a horizontal direction;
- the sixth pixel areas consist of the third pixels and the second pixels arranged adjacently in order, and circulated to form a row in a horizontal direction; wherein the second pixels in the sixth pixel areas and the second pixels in the fifth pixel areas are in a same column;
- the seventh pixel areas consist of the second pixels and the first pixels arranged adjacently in order, and circulated to form a row in a horizontal direction; wherein the second pixels in the seventh pixel areas and the third pixels in the sixth pixel areas are in a same column;
- the eighth pixel areas consist of the second pixels and the third pixels arranged adjacently in order, and circulated to form a row in a horizontal direction; wherein the second pixels in the eighth pixel areas and the second pixels in the seventh pixel areas are in a same column;
- the pixel groups are made of the fifth pixel areas, the sixth pixel areas, the seventh pixel areas and the eighth pixel areas spaced alternately in a vertical direction;
- the organic light-emitting diode display panel further comprises a plurality of first kind of apertures and a plurality of second kind of apertures;
- wherein, an area of the plurality of the first kind of apertures is smaller than an area of the plurality of the second kind of apertures, and at least one of the first kind of apertures of the plurality of first kind of apertures and at least one of the second kind of apertures of the plurality of second kind of apertures are vertically configured on organic light-emitting diode the display panel;
- wherein the at least a segment of the plurality of the first kind of apertures corresponds to a column of pixels with a same color of a pixel group of the plurality of pixel groups arranged adjacent to the at least a segment of the plurality of the first kind of apertures,
- wherein two adjacently configured first kind of apertures of the plurality of the first kind of apertures are closure than two evenly spaced second kind of apertures of the plurality of the second kind of apertures.

6. The pixel arrangement structure of the organic light-emitting diode display panel according to claim 5, wherein areas of the first pixels, the second pixels and the third pixels are same.

7. The pixel arrangement structure of the organic light-emitting diode display panel according to claim 5, wherein the first pixels, the second pixels and the third pixels are configured to emit light with different colors.

8. The pixel arrangement structure of the organic light-emitting diode display panel according to claim 5, wherein the first pixels emit red light, the second pixels emit green light, and the third pixels emit blue light.

* * * * *